United States Patent
Hsu et al.

(10) Patent No.: US 10,125,316 B2
(45) Date of Patent: Nov. 13, 2018

(54) ETCHING SOLUTION AND MANUFACTURING METHOD OF DISPLAY

(71) Applicant: Innolux Corporation, Miao-Li County (TW)

(72) Inventors: Po-Yun Hsu, Miao-Li County (TW); Chi-Che Tsai, Miao-Li County (TW); Ker-Yih Kao, Miao-Li County (TW)

(73) Assignee: INNOLUX CORPORATION, Miao-li (TW)

( * ) Notice: Subject to any disclaimer, the term of this patent is extended or adjusted under 35 U.S.C. 154(b) by 0 days.

(21) Appl. No.: 15/813,290

(22) Filed: Nov. 15, 2017

(65) Prior Publication Data
US 2018/0171227 A1  Jun. 21, 2018

Related U.S. Application Data

(60) Provisional application No. 62/437,043, filed on Dec. 20, 2016.

(30) Foreign Application Priority Data

May 8, 2017  (CN) .......................... 2017 1 0317772

(51) Int. Cl.
*C09K 13/06* (2006.01)
*H01L 21/3213* (2006.01)
*C23F 1/26* (2006.01)
*C23F 1/18* (2006.01)

(52) U.S. Cl.
CPC ............. *C09K 13/06* (2013.01); *C23F 1/18* (2013.01); *C23F 1/26* (2013.01); *H01L 21/32134* (2013.01)

(58) Field of Classification Search
CPC ...................................................... C09K 13/06
USPC ....................................................... 252/79.4
See application file for complete search history.

(56) References Cited

U.S. PATENT DOCUMENTS

2018/0148645 A1* 5/2018 Lee .................... C09K 13/06

* cited by examiner

*Primary Examiner* — Roberts P Culbert
(74) *Attorney, Agent, or Firm* — McClure, Qualey & Rodack, LLP

(57) ABSTRACT

An etching solution and a manufacturing method of a display are provided. The etching solution includes hydrogen peroxide ($H_2O_2$), succinic acid, malonic acid, acetic acid, sulfuric acid, 1-amino-2-propanol, 5-amino-1H-tetrazole, N,N,N'N'-tetrakis(2-hydroxypropyl) ethylenediamine (EDTP) and glycine homogenously mixed in deionized water. Hydrogen peroxide is in an amount of 5-10 wt % of the etching solution, succinic acid is in an amount of 0.5-10 wt % of the etching solution, malonic acid is in an amount of 0.5-10 wt % of the etching solution, acetic acid is in an amount of 1-10 wt % of the etching solution, sulfuric acid is in an amount of 0.5-5 wt % of the etching solution, 1-amino-2-propanol is in an amount of 1-20 wt % of the etching solution, 5-amino-1H-tetrazole is in an amount of 0.01-0.5 wt % of the etching solution, EDTP is in an amount of 1-15 wt % of the etching solution, and glycine is in an amount of 1-5 wt % of the etching solution.

10 Claims, 2 Drawing Sheets

ETCHING SOLUTION AND MANUFACTURING METHOD OF DISPLAY

This application claims the benefit of U.S. provisional application Ser. No. 62/437,043, filed Dec. 20, 2016, and People's Republic of China application Serial No. 201710317772.1, filed May 8, 2017, the subject matter of which are incorporated herein by reference.

TECHNICAL FIELD

The present disclosure relates to an etching solution and a manufacturing method of a display, and particularly relates to an etching solution and a manufacturing method of a display using the etching solution.

BACKGROUND

According to the needs such as sizes and functions of semiconductor devices, many manufacturing steps are included in the semiconductor manufacturing processes, for example, deposition steps, patterning steps, thermal treatment steps, and etc. In order to increase process yields as well as reduce manufacturing costs, industry has been working on various improvements and developments for each of the steps.

SUMMARY

The present disclosure relates to an etching solution and a manufacturing method of a display. By applying the etching solution according to the embodiments of the present disclosure to perform a patterning process on a metal layer, the etched metal layer can form a lateral side with an included angle of equal to or smaller than 60 degrees, such that the slope of the lateral side is relatively gentle and smooth, and thus when another layer is formed on the metal layer subsequently, the subsequently formed layer is less vulnerable to cleavage or breakage.

According to an embodiment, an etching solution is provided. The etching solution includes hydrogen peroxide ($H_2O_2$), succinic acid, malonic acid, acetic acid, sulfuric acid, 1-amino-2-propanol, 5-amino-1H-tetrazole, N,N,N'N'-tetrakis(2-hydroxypropyl) ethylenediamine (EDTP) and glycine homogenously mixed in deionized water. Hydrogen peroxide is in an amount of 5-10 wt % of the etching solution, succinic acid is in an amount of 0.5-10 wt % of the etching solution, malonic acid is in an amount of 0.5-10 wt % of the etching solution, acetic acid is in an amount of 1-10 wt % of the etching solution, sulfuric acid is in an amount of 0.5-5 wt % of the etching solution, 1-amino-2-propanol is in an amount of 1-20 wt % of the etching solution, 5-amino-1H-tetrazole is in an amount of 0.01-0.5 wt % of the etching solution, EDTP is in an amount of 1-15 wt % of the etching solution, and glycine is in an amount of 1-5 wt % of the etching solution.

According to another embodiment of the present disclosure, a manufacturing method of a display is provided. The manufacturing method of the display includes the following steps: providing a first substrate; forming a metal layer on the first substrate; applying the etching solution according to claim 1 on the metal layer for performing a patterning process; forming a display layer on the metal layer; and providing a second substrate on the display layer.

The following description is made with reference to the accompanying drawings and embodiments.

DETAILED DESCRIPTION

Figure 1A:
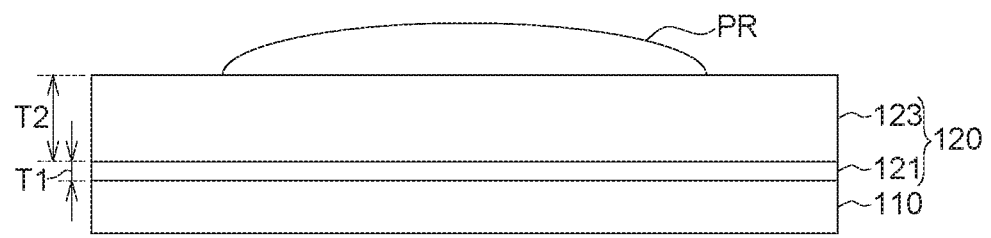
FIG. 1A to FIG. 1D show a process of etching a metal layer by an etching solution according to an embodiment of the present disclosure.

The following description of the embodiments of the present disclosure is made with reference to the accompanying drawings. The elements sharing similar or the same labels are similar or the same elements in the drawings. It is to be noted that the accompanying drawings are simplified for clearly describing the disclosure. The detailed structures disclosed in the embodiments are for exemplification only, not for limiting the scope of protection of the disclosure. One of ordinary skills in the art may modify or change the structures according to actual needs.

According to the embodiments of the present disclosure, an etching solution is provided hereinafter. According to the embodiments of the present disclosure, the etching solution may be used in such as a pattering process of a metal layer in a display.

In some embodiments, the etching solution includes hydrogen peroxide ($H_2O_2$), succinic acid, malonic acid, acetic acid, sulfuric acid, 1-amino-2-propanol, 5-amino-1H-tetrazole, N,N,N',N'-tetrakis(2-hydroxypropyl) ethylenediamine (EDTP) and glycine homogenously mixed in deionized water.

By applying the etching solution according to the embodiments of the present disclosure to perform a patterning process on a metal layer, the etched metal layer can form a lateral side with an included angle of equal to or smaller than 60 degrees, such that the slope of the lateral side is relatively gentle and smooth, and thus when another layer is formed on the metal layer subsequently, the subsequently formed layer is less vulnerable to cleavage or breakage.

In an embodiment, hydrogen peroxide ($H_2O_2$) is in an amount of about 5-10 wt % of the etching solution.

In an embodiment, succinic acid is in an amount of about 0.5-10 wt % of the etching solution. In another embodiment, succinic acid is in an amount of about 2-6 wt % of the etching solution.

In an embodiment, malonic acid is in an amount of about 0.5-10 wt % of the etching solution. In another embodiment, malonic acid is in an amount of about 1.5-4.5 wt % of the etching solution.

In an embodiment, acetic acid is in an amount of about 1-10 wt % of the etching solution.

In an embodiment, sulfuric acid is in an amount of about 0.5-5 wt % of the etching solution.

In an embodiment, 1-amino-2-propanol is in an amount of about 1-20 wt % of the etching solution.

In an embodiment, 5-amino-1H-tetrazole is in an amount of about 0.01-0.5 wt % of the etching solution.

In an embodiment, EDTP is in an amount of about 1-15 wt % of the etching solution.

In an embodiment, glycine is in an amount of about 1-5 wt % of the etching solution.

In some embodiments, the etching solution may further include sodium dioctyl sulfosuccinate. In an embodiment, sodium dioctyl sulfosuccinate is in an amount of about 0.1-0.5 wt % of the etching solution.

In some embodiments, the etching solution may further include sodium phenolsulfonate. In an embodiment, sodium phenolsulfonate is in an amount of about 0.5-5 wt % of the etching solution.

In some embodiments, the etching solution of the present disclosure can be used for etching a multi-layered composite metal layer including at least a copper (Cu) layer and a molybdenum (Mo) layer, wherein the thickness of the Cu layer may be larger than the thickness of the Mo layer. For example, in an embodiment, the thickness of the Cu layer may be such as about 3000 Å, and the thickness of the Mo layer may be such as about 150 Å. In some embodiments, the temperature for the etching process is about 30-35° C., and the etching time for the etching process is about 105 seconds.

In some embodiments, the pH value of the etching solution of the present disclosure may be between 3.5 and 5.5 ($3.55 \leq pH \leq 5.5$). If the pH value is smaller than 2.5, the effects of etching stop agents (1-amino-2-propanol and 5-amino-1H-tetrazole) will be decreased.

In some embodiments, since phosphoric acid may accelerate the etching rate, the etching solution of the present disclosure may not include phosphoric acid. In some embodiments, since nitric acid may damage photoresists, the etching solution of the present disclosure may not include nitric acid.

According to the embodiments of the present disclosure, hydrogen peroxide may be used as an oxidizing agent for oxidizing metal.

According to the embodiments of the present disclosure, sodium phenolsulfonate may be optionally added into the etching solution as a stabilizer for oxidizing agent, such that the activity of the oxidizing agent may be stabilized or the oxidizing agent may be prevented from being decomposed too quickly, and thus the lifetime of the oxidizing agent may be prolonged.

According to the embodiments of the present disclosure, succinic acid, malonic acid, acetic acid and sulfuric acid may be etchants for etching metals or metal oxides, and 1-amino-2-propanol and 5-amino-1H-tetrazole may be etching inhibitors for controlling the etching rates, thus the shapes of etched metals may be further controlled.

In some embodiments, the etching solution of the present disclosure may not include fluorine-containing acid. For example, the etching solution of the present disclosure may not include hydrofluoric acid (HF).

According to the embodiments of the present disclosure, EDTP and glycine may be chelating agents for chelation of metal ions to form metal complexes which are relatively stable; thus, decomposition of the oxidizing agent caused by reacting with metal ions may be further decreased.

According to the embodiments of the present disclosure, sodium dioctyl sulfosuccinate may be optionally added into the etching solution to increase the etching uniformity.

Specifically speaking, when a metal layer reacts with the etching solution, at least a portion of the metal is oxidized by the oxidizing agent and forms metal oxides, and the as-formed metal oxides may be further etched by the etchant(s) to form metal ions. These metal ions may further react with the chelating agents to form stable metal complexes. As above-mentioned, with each of the components and of which the respective functions, effectively etching the metal layer, controlling the etching rates, prolonging the activity of the oxidizing agent and/or increasing the etching uniformity can be achieved.

FIGS. 1A-1D show a process of etching a metal layer by an etching solution according to an embodiment of the present disclosure. It is to be noted that the process of the present disclosure can represent any process for etching any metal layer in a manufacturing process of a transistor component or any metal wires.

As shown in FIG. 1A, a first substrate 110 is provided, and a metal layer 120 is formed on the first substrate 110. In some embodiments, the first substrate 110 is such as a glass substrate; in some embodiments, the first substrate 110 may as well be a composite film including a passivation layer, a metal oxide semiconductor layer (e.g. an ITO layer), an amorphous silicon layer and/or a silicon nitride layer, or any layer formed of suitable material(s), but the disclosure is not limited thereto.

As shown in FIG. 1A, the metal layer 120 includes such as a molybdenum (Mo) layer 121 and a copper (Cu) layer 123. The Mo layer 121 may be formed on the firs substrate 110, and then the Cu layer 123 is formed on the Mo layer 121.

In some embodiments, the thickness T1 of the Mo layer 121 is about 100-400 Å (100 Å$\leq$T1$\leq$400 Å), and the thickness T2 of the Cu layer 123 is about 2500-10000 Å (2500 Å$\leq$T$\leq$10000 Å).

Figure 1B:
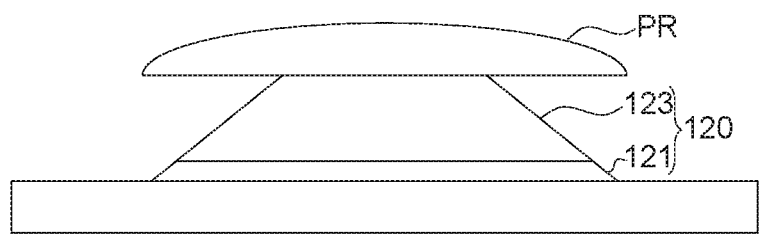

Next, as shown in FIGS. 1B-2C, the etching solution of the present disclosure is applied on the metal layer 120 for performing a patterning process. For example, as shown in FIGS. 1A-1B, the photoresist layer PR may be formed on the metal layer 120, and then the metal layer 120 is etched according to the photoresist layer PR by the etching solution of the present disclosure. In some embodiments, the etching rate is about 60-125 Å/sec. In some other embodiments, the etching rate is about 80-100 Å/sec.

Figure 1C:
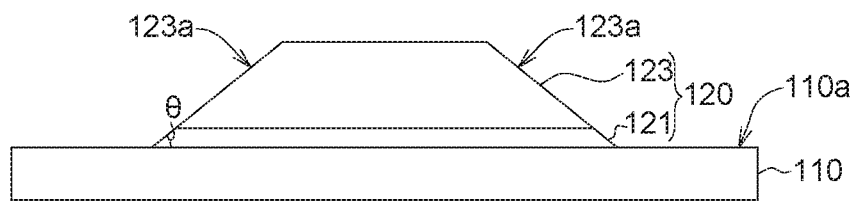

Next, as shown in FIG. 1C, the photoresist layer PR is removed.

In the embodiment, as shown in FIG. 1C, the cross-section of the etched metal layer 120 has a substantially tapered shape. Since the thickness T1 of the Mo layer 121 is smaller than the thickness T2 of the Cu layer 123, thus in fact the cross-section of the Cu layer 123 has a tapered shape. FIG. 1C shows the cross-sectional view of the cross-section of the etched metal layer 120. For example, the etched metal layer 120 may have a wire pattern with an extending direction, and the cross-section of the metal layer 120 as shown in FIG. 1C is the cross-section perpendicular to the aforementioned extending direction of the wire pattern. In addition, in the embodiment as shown in FIG. 1C, the lateral side 123a of the Cu layer 123 has a smooth surface; in other embodiments, the lateral side 123a of the Cu layer 123 may have such as a roughened surface, but the present disclosure is not limited thereto.

In some embodiments, an included angle θ between an extending line of the lateral side 123a of the Cu layer 123 and a surface 110a of the first substrate 110 is larger than 0 degree and smaller than or equal to 60 degrees (0 degree<θ$\leq$60 degrees). In the embodiment as shown in FIG. 10, the included angle θ between the extending line of the lateral side 123a of the Cu layer 123 and the surface 110a of the first substrate 110 is the same as an included angle between an extending line of the lateral side of the Mo layer 121 and the surface 110a of the first substrate 110. In other embodiments, the included angle θ between the extending line of the lateral side 123a of the Cu layer 123 and the surface 110a may be different from the included angle between the extending line of the lateral side of the Mo layer 121 and the surface 110a. For example, the included angle between the extending line of the lateral side of the Mo layer 121 and the surface 110a of the first substrate 110 may be larger than 0 degree to smaller than 90 degrees (0 degree<included angle<90 degrees), and this included angle (not shown in drawings) may be different from the included angle θ, but the present disclosure is not limited thereto. Since the thickness T1 of the Mo layer 121 is smaller than the thickness T2 of the Cu layer 123, and thus the included angle θ of the present disclosure refers to the included angle θ between the extending line of the lateral side 123a of the Cu layer 123 and the surface 110a of the first substrate 110. According to the embodiments of the present disclosure, the included angle θ between the extending line of the lateral side 123a of the Cu layer 123 and the surface 110a of the first substrate 110 being smaller than or equal to 60 degrees (θ≤60 degrees) indicates that the slope of the lateral side 123a of the Cu layer 123 is relatively gentle and smooth, and thus when another layer is formed on the Cu layer 123 subsequently, the subsequently formed layer is less vulnerable to cleavage or breakage.

Figure 1D:
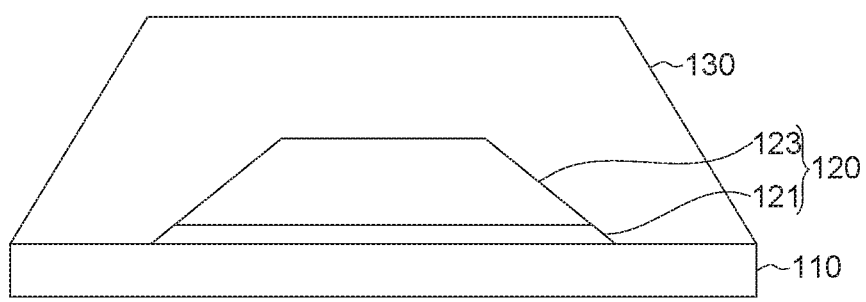

Next, as shown in FIG. 1D, an insulation layer 130 may be optionally formed on the metal layer 120. In the embodiments, the included angle θ between the extending line of the lateral side 123a of the Cu layer 123 and the surface 110a of the first substrate 110 is smaller than or equal to 60 degrees (θ≤60 degrees), such that another layer subsequently formed on the insulation layer 130 is less vulnerable to cleavage or breakage.

Figure 2:
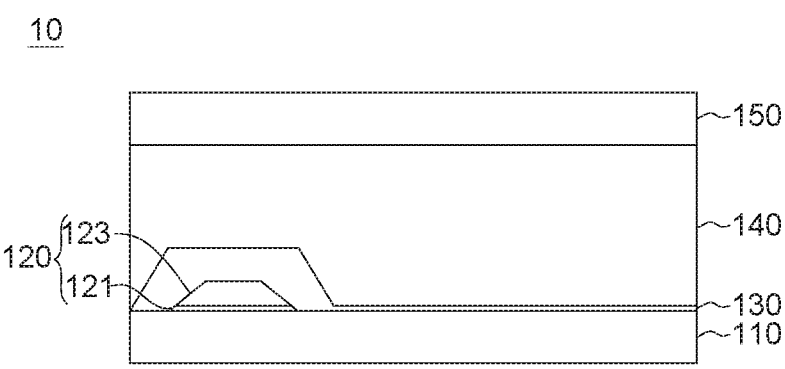
FIG. 2 shows a manufacturing process of a display according to an embodiment of the present disclosure.

FIG. 2 shows a manufacturing process of a display according to an embodiment of the present disclosure. The elements in the embodiment sharing similar or the same labels with those in the previous embodiment are similar or the same elements, and the description of which is omitted. It is to be noted that some components are simplified or omitted in FIG. 2 for clearly describing the disclosure. For example, the metal layer 120 as shown in FIG. 2 may represent the structure of any layer in a transistor component or any metal wires.

Please refer to FIGS. 1A-1D and FIG. 2. As shown in FIGS. 1A-1D and FIG. 2, the first substrate 110 is provided, the metal layer 120 is formed on the first substrate 110, the etching solution according to the present disclosure is applied on the metal layer 120 for performing a patterning process, and an insulation layer 130 is optionally formed on the metal layer 120.

Next, as shown in FIG. 2, a display layer 140 is formed on the metal layer 120, and a second substrate 150 is provided on the display layer 140. As such, the display 10 as shown in FIG. 2 is formed.

In some embodiments, the display layer 140 may include liquid crystals, organic light emitting diodes, quantum dots, light emitting diodes, micro-light emitting diodes, or other types of display medium, but the present disclosure is not limited thereto. In some embodiments, the second substrate 150 may include glass, an encapsulation layer, a flexible substrate, or a protection layer, but the present disclosure is not limited thereto. In some embodiments, the display 10 may be a flexible display, a touch display, a curved display, or other types of displays, but the present disclosure is not limited thereto.

Further explanation is provided with the following examples. Compositions of etching solutions of embodiments and comparative embodiments are listed for showing the properties of metal layers made by etching processes applying the etching solution according to the embodiments of the disclosure. However, the following examples are for purposes of describing particular embodiments only, and are not intended to be limiting. The compositions of the etching solutions of the embodiments and the properties of etched metal layers are listed in table 1, and the compositions of the etching solutions of the comparative embodiments and the properties of etched metal layers are listed in table 2. The ratio of each of the components is represented by the amount of weight percentage (wt %) in each of the etching solutions, "N/A" indicates that the indicated component is not included in the composition, and the remainder component of each the compositions of the embodiments and the comparative embodiments is deionized water. In each of the compositions of the embodiments and the comparative embodiments, the sum of the weight percentages of the listed components and deionized water in total is 100 wt %.

TABLE 1

|  | Embodiment 1 | Embodiment 2 | Embodiment 3 | Embodiment 4 | Embodiment 5 |
| --- | --- | --- | --- | --- | --- |
| $H_2O_2$ | 9 | 9 | 9 | 9 | 9 |
| Succinic acid | 0.5 | 2 | 4 | 6 | 2 |
| Malonic acid | 0.5 | 1.5 | 3 | 4.5 | 1.5 |
| Acetic acid | 2 | 6 | 6 | 6 | 6 |
| Sulfuric acid | 2.5 | 3.98 | 2.78 | 0 | 3.98 |
| 1-amino-2-propanol | 10 | 10 | 10 | 10 | 10 |
| 5-amino-1H-tetrazole | 0.2 | 0.02 | 0.02 | 0.02 | 0.03 |
| EDTP | 3 | 6 | 6 | 6 | 6 |
| Glycine | 1 | 1 | 1 | 1 | 1 |
| Sodium dioctyl sulfosuccinate | 0.2 | 0.2 | 0.2 | 0.2 | 0.2 |
| Sodium phenolsulfonate | 1 | 2 | 2 | 2 | 2 |
| Included angle (θ) | 26.81° | 43.23° | 37.80° | 34.12° | 27.93° |

TABLE 2

|  | Comparative embodiment 1 | Comparative embodiment 2 | Comparative embodiment 3 |
| --- | --- | --- | --- |
| $H_2O_2$ | 8 | 12 | 9 |
| Succinic acid | 2 | 1.87 | 2 |
| Malonic acid | 1.5 | 1.5 | 1.5 |
| Acetic acid | 6 | 6 | 6 |
| Sulfuric acid | N/A | N/A | N/A |
| 1-amino-2-propanol | 8.4 | 6.3 | 10 |
| 5-amino-1H-tetrazole | 0.02 | 0.06 | 0.03 |
| EDTP | N/A | 4.7 | 6 |
| EDTA | 3 | N/A | N/A |
| Glycine | N/A | 1 | 1 |
| Sodium dioctyl sulfosuccinate | N/A | N/A | N/A |
| $KH_2PO_4$ | N/A | 0.3 | N/A |
| 49% HF | N/A | 0.3 | 0.8 |
| Sodium phenolsulfonate | N/A | 1 | 2 |
| Properties of etched metal layers | Metal materials remained on the substrate | undercut | Substrate surfaces corroded |

As shown in table 1, all of the etching solutions of embodiments 1-5 are provided with excellent etching effects, and the included angles between the extending line of the lateral side of the metal layers (Cu layers) and the surface of the first substrate are all smaller than 60 degrees.

As shown in table 2, when the weight percentage of hydrogen peroxide exceeds 10 wt %, an undercut may easily occur in the etched metal layers. For example, an undercut occurs when the components in the etching solution result in higher etching rate for the Mo layer 121 than the Cu layer 123, such that a higher amount of the Mo layer 121 is etched compared to the Cu layer 123, resulting in a recessed profile wherein the edge of the Cu layer 123 is suspended without supports from the Mo layer 121 underneath, and it may cause cleavages or breakages to the subsequently formed layer(s). When the etching solutions include hydrofluoric acid, over-etching easily occur and thus the surface of the substrates are corroded. When the etching solution includes EDTA, the metal layer is not etched completely, and metal materials are remained on the substrate which may cause electric current leakage.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An etching solution, comprising:
hydrogen peroxide ($H_2O_2$), succinic acid, malonic acid, acetic acid, sulfuric acid, 1-amino-2-propanol, 5-amino-1H-tetrazole, N,N,N'N'-tetrakis(2-hydroxypropyl) ethylenediamine (EDTP) and glycine homogenously mixed in deionized water,
wherein hydrogen peroxide is in an amount of 5-10 wt % of the etching solution, succinic acid is in an amount of 0.5-10 wt % of the etching solution, malonic acid is in an amount of 0.5-10 wt % of the etching solution, acetic acid is in an amount of 1-10 wt % of the etching solution, sulfuric acid is in an amount of 0.5-5 wt % of the etching solution, 1-amino-2-propanol is in an amount of 1-20 wt % of the etching solution, 5-amino-1H-tetrazole is in an amount of 0.01-0.5 wt % of the etching solution, EDTP is in an amount of 1-15 wt % of the etching solution, and glycine is in an amount of 1-5 wt % of the etching solution.

2. The etching solution according to claim 1, further comprising sodium dioctyl sulfosuccinate.

3. The etching solution according to claim 2, wherein sodium dioctyl sulfosuccinate is in an amount of 0.1-0.5 wt % of the etching solution.

4. The etching solution according to claim 1, further comprising sodium phenolsulfonate.

5. The etching solution according to claim 4, wherein sodium phenolsulfonate is in an amount of 0.5-5 wt % of the etching solution.

6. The etching solution according to claim 1, wherein a pH value of the etching solution is between 3.5 and 5.5.

7. A manufacturing method of a display, comprising:
providing a first substrate;
forming a metal layer on the first substrate;
applying the etching solution on the metal layer for performing a patterning process, wherein the etching solution comprises:
hydrogen peroxide ($H_2O_2$), succinic acid, malonic acid, acetic acid, sulfuric acid, 1-amino-2-propanol, 5-amino-1H-tetrazole, N,N,N'N'-tetrakis(2-hydroxypropyl) ethylenediamine (EDTP) and glycine homogenously mixed in deionized water,
wherein hydrogen peroxide is in an amount of 5-10 wt % of the etching solution, succinic acid is in an amount of 0.5-10 wt % of the etching solution, malonic acid is in an amount of 0.5-10 wt % of the etching solution, acetic acid is in an amount of 1-10 wt % of the etching solution, sulfuric acid is in an amount of 0.5-5 wt % of the etching solution, 1-amino-2-propanol is in an amount of 1-20 wt % of the etching solution, 5-amino-1H-tetrazole is in an amount of 0.01-0.5 wt % of the etching solution, EDTP is in an amount of 1-15 wt % of the etching solution, and glycine is in an amount of 1-5 wt % of the etching solution;
forming a display layer on the metal layer; and
providing a second substrate on the display layer.

8. The manufacturing method of the display according to claim 7, further comprising:
forming an insulation layer on the metal layer.

9. The manufacturing method of the display according to claim 7, wherein the metal layer comprises a molybdenum (Mo) layer and a copper (Cu) layer, and forming the metal layer on the first substrate further comprises:
forming the Mo layer on the first substrate; and
forming the Cu layer on the Mo layer.

10. The manufacturing method of the display according to claim 9, wherein an included angle between an extending line of a lateral side of the Cu layer and a surface of the first substrate is larger than 0 degree and smaller than or equal to 60 degrees.

* * * * *